US008853988B2

(12) United States Patent
Binnard et al.

(10) Patent No.: US 8,853,988 B2
(45) Date of Patent: Oct. 7, 2014

(54) CONTROL SYSTEMS AND METHODS FOR COMPENSATING FOR EFFECTS OF A STAGE MOTOR

(75) Inventors: Michael B. Binnard, Belmont, CA (US); Scott Coakley, Belmont, CA (US); Douglas C. Watson, Campbell, CA (US); Pai-Hsueh Yang, Palo Alto, CA (US)

(73) Assignee: Nikon Corporation, Tokyo (JP)

( * ) Notice: Subject to any disclaimer, the term of this patent is extended or adjusted under 35 U.S.C. 154(b) by 673 days.

(21) Appl. No.: 12/406,322

(22) Filed: Mar. 18, 2009

(65) Prior Publication Data

US 2010/0237819 A1   Sep. 23, 2010

(51) Int. Cl.
| | |
|---|---|
| G05B 1/06 | (2006.01) |
| G05B 19/404 | (2006.01) |
| G03F 7/20 | (2006.01) |

(52) U.S. Cl.
CPC .......... *G05B 19/404* (2013.01); *G03F 7/70725* (2013.01); *G05B 2219/41128* (2013.01); *G05B 2219/41443* (2013.01); *G03F 7/70758* (2013.01)
USPC ........... 318/638; 318/560; 318/632; 318/648; 318/649

(58) Field of Classification Search
USPC ............................ 318/560, 632, 638, 648, 649
See application file for complete search history.

(56) References Cited

U.S. PATENT DOCUMENTS

| | | | | |
|---|---|---|---|---|
| 4,573,002 | A * | 2/1986 | Kurakake et al. | 318/721 |
| 5,184,055 | A * | 2/1993 | Ohishi et al. | 318/615 |
| 5,528,118 | A | 6/1996 | Lee | |
| 5,569,994 | A * | 10/1996 | Taylor et al. | 318/700 |
| 5,594,307 | A * | 1/1997 | Adachi et al. | 318/280 |
| 5,623,853 | A | 4/1997 | Novak et al. | |
| 5,793,052 | A | 8/1998 | Kawaguchi | |
| 6,504,162 | B1 | 1/2003 | Binnard et al. | |
| 6,570,273 | B2 | 5/2003 | Hazelton | |
| 7,181,296 | B2 | 2/2007 | Rotariu et al. | |
| 7,319,570 | B2 * | 1/2008 | Jia et al. | 360/77.02 |
| 7,643,733 | B2 * | 1/2010 | El-Antably et al. | 388/820 |
| 8,392,003 | B2 * | 3/2013 | Wiener | 700/78 |
| 2003/0098664 | A1 * | 5/2003 | Watson et al. | 318/649 |
| 2004/0238758 | A1 * | 12/2004 | Dams | 250/491.1 |
| 2005/0023486 | A1 * | 2/2005 | Takakuwa et al. | 250/492.2 |
| 2005/0094309 | A1 * | 5/2005 | Lee | 360/78.06 |

(Continued)

FOREIGN PATENT DOCUMENTS

| | | | | | |
|---|---|---|---|---|---|
| JP | 09128006 | A * | 5/1997 | | G05B 11/36 |
| JP | 2004148920 | A * | 5/2004 | | |

OTHER PUBLICATIONS

Machine translation of JP 2004148920 A.*

*Primary Examiner* — Kawing Chan
(74) *Attorney, Agent, or Firm* — Roeder & Broder LLP

(57) ABSTRACT

Embodiments of the invention compensate for one or more effects of a stage motor in a precision stage device. A feedforward module receives an input signal corresponding to the effect of the motor and generates a feedforward control signal that can be used to modify a motor control signal to compensate for the effect of the motor. In some embodiments, a control system is provided to compensate for a back-electromotive force generated by a motor, while in other embodiments, a control system may compensate for an inductive effect of a motor. Embodiments of the invention may be useful in precision stage devices, for example, lithography devices such as steppers and scanners.

10 Claims, 11 Drawing Sheets

(56) References Cited

U.S. PATENT DOCUMENTS

| | | |
|---|---|---|
| 2005/0231706 A1 | 10/2005 | Yang et al. |
| 2006/0007615 A1* | 1/2006 | Ochiai et al. .................... 361/71 |
| 2006/0076916 A1* | 4/2006 | Heilig et al. .................. 318/437 |
| 2006/0158773 A1* | 7/2006 | Semba et al. .............. 360/78.06 |
| 2006/0170382 A1 | 8/2006 | Yang et al. |
| 2006/0285101 A1* | 12/2006 | Butler et al. .................... 355/75 |
| 2007/0029960 A1* | 2/2007 | Hoppe et al. .................. 318/432 |
| 2007/0090782 A1* | 4/2007 | Endo et al. .................... 318/432 |
| 2007/0107978 A1* | 5/2007 | Aoki et al. .................... 180/446 |
| 2007/0229795 A1* | 10/2007 | Zhang et al. .................... 355/77 |
| 2007/0268475 A1 | 11/2007 | Binnard |
| 2008/0067968 A1 | 3/2008 | Binnard et al. |
| 2008/0180047 A1* | 7/2008 | Bonvin .................... 318/400.06 |
| 2009/0154311 A1* | 6/2009 | Wiener .................... 369/44.32 |
| 2010/0060210 A1* | 3/2010 | Liu et al. .................. 318/400.02 |
| 2010/0090637 A1* | 4/2010 | Savitz .......................... 318/494 |

* cited by examiner

CONTROL SYSTEMS AND METHODS FOR COMPENSATING FOR EFFECTS OF A STAGE MOTOR

FIELD

The present invention relates generally to control systems and methods for controlling the trajectory and alignment of one or more stages in a precision stage device, such as, for example, a semiconductor wafer exposure system. More particularly, the invention relates to compensating for one or more effects of a motor used to move a stage.

BACKGROUND

An exposure apparatus is one type of precision stage device that is commonly used to transfer images from a mask to a substrate in various manufacturing processes. A typical exposure apparatus usually includes one or more stages or plants for retaining and moving the mask and/or the substrate. One example of an exposure apparatus is a lithography device called a wafer scanner or wafer stepper, which performs one of the many essential steps in the manufacturing process of integrated circuits (ICs). The wafer scanner or stepper includes a reticle stage that retains a reticle, i.e., mask, and a wafer stage that retains a semiconductor wafer, i.e., substrate. During the manufacturing process, a control system directs a control signal to one or more motors coupled to the reticle stage and/or wafer stage to generate forces that position one or both of the stages relative to an illumination source and optical assembly with high precision.

As the circuitry on ICs become smaller, the precision required for controlling movement of the stages increases proportionally. In order to meet specifications that are currently on the order of nanometers, control systems require careful design. Precise positioning of the wafer and the reticle relative to the optical assembly is critical to the manufacture of high density, semiconductor wafers.

During stage control, a variety of disturbances can lead to errors in stage movement. For example, the stage may develop a following or positioning error quantified as the difference between an intended or desired trajectory of the stage and an actual trajectory of the stage at a specified time. In other cases the stage may experience periodic or repeating vibrations or ripple forces. As a result, precision in the manufacture of the semiconductor wafers can be compromised, potentially leading to issues in production quality and throughput. In some cases, one or more effects of a stage motor can contribute to errors in stage movement and less than desirable performance in general.

Although existing control systems reduce unwanted disturbances and corresponding movement errors to some degree (e.g., through vibration damping systems), there is significant room for improvement. Along with the ever-present desire to manufacture smaller ICs and other micro-devices comes a requirement for even more precise stage movement with smaller disturbances and movement errors. Thus, there is a need for control methods and systems that can improve the accuracy in the positioning of one or more stages of a precision stage device. Further, there is a need for control systems and methods that can accurately compensate for one or more effects of a stage motor on a stage control system.

SUMMARY

Embodiments of the invention provide control systems and methods for compensating for one or more effects of a motor in a stage device. According to one aspect of the invention, a control system performs a method of compensating for a motor effect that includes generating a motor control signal to drive a motor in a stage device and receiving an input signal corresponding to an effect of the motor upon the motor control signal. Based on the input signal, a feedforward control signal is generated to modify the motor control signal to compensate for the effect of the motor.

Some embodiments of a compensation method may compensate for an electromotive force generated by a stage motor. For example, a stage motor may generate an electromotive force varying with a position of a moving member of the motor as the moving member moves through a magnetic field.

The input signal may directly or indirectly indicate the effect of the motor, by, for example, indicating a position of the stage or moving member. In some cases, the input signal may be based on a feedback signal indicating a measured position of the moving member, while in other cases the input signal may be based on a control signal indicating a desired position of the moving member. The feedforward control signal may then be generated by determining a value of the electromotive force corresponding to a current or future position of the moving member of the motor. In some cases the feedforward control signal is generated based on an inverse transfer function of a motor drive circuit.

In some embodiments the value of the electromotive force is determined using a lookup table with multiple values of the electromotive force corresponding to respective positions of the moving member along a range of travel. The lookup table may include simulated or empirical values.

Certain embodiments of the invention may compensate for an inductive effect of a stage motor. For example, a feedforward control signal may be generated based on a desired feedforward voltage to compensate for an inductive load presented by the motor. In some embodiments the feedforward voltage can be determined based on the inductance and resistance of the motor and a change in the motor control signal indicated by an input or feedback signal.

According to another aspect of the invention, a method of operating an exposure apparatus includes transporting a substrate, such as a wafer, with a stage having one or more motors. A control system signals the motors to move the substrate while compensating for an effect of the one or more motors. After positioning the substrate, the method includes exposing the substrate with radiant energy.

In another aspect of the invention, a method of making a micro-device, such as, for example, a semiconductor wafer, LCD element, or thin-film magnetic head is provided. In some embodiments the method includes at least a photolithography process employing a control method to position a stage while compensating for one or more effects of a stage motor.

DETAILED DESCRIPTION OF THE PREFERRED EMBODIMENTS

Figure 1:
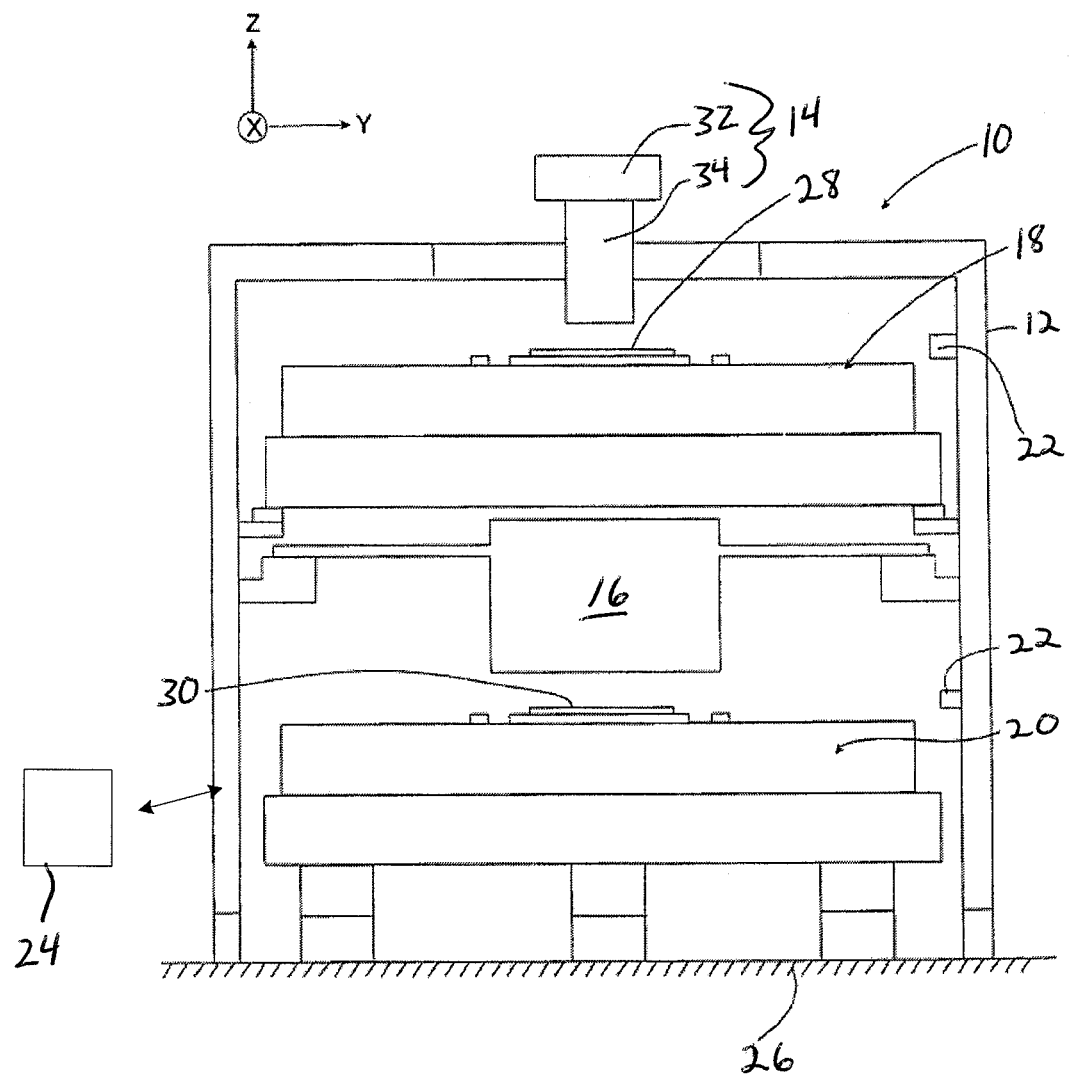
FIG. 1 is a schematic illustration of a precision stage device in accordance with an embodiment of the invention.

The following detailed description should be read with reference to the drawings, in which like elements in different drawings are numbered identically. It will be understood that embodiments shown in the drawings and described herein are merely for illustrative purposes and are not intended to limit the invention to any embodiment. On the contrary, it is intended to cover alternatives, modifications, and equivalents as may be included within the scope of the invention as defined by the appended claims.

Embodiments of the present invention provide, among other things, control systems and methods for compensating for effects caused by one or more motors in a precision stage device. According to some embodiments, the invention provides control systems and methods for controlling stage movement that are particularly suited for use in a type of exposure apparatus. For example, such an exposure apparatus can be a photolithography device such as a scanner or stepper for producing micro-devices such as semiconductor wafers, flat panel displays (LCD), or thin-film magnetic heads (TFH). However, the invention is not restricted to any particular implementation and may be useful in positioning a stage in a variety of precision stage devices.

FIG. 1 is a schematic illustration of a type of precision stage device, namely an exposure apparatus or lithography device 10 having features of the present invention according to some embodiments. The exposure apparatus 10 includes a frame 12, an illumination system 14 (irradiation apparatus), an optical assembly 16, a reticle stage assembly 18, a wafer stage assembly 20, a measurement system 22, and a control system 24. The exposure apparatus 10 mounts to a mounting base 26, e.g., the ground, a base, or floor or some other supporting structure. The design of the components of the exposure apparatus 10 can be varied to suit the design requirements of a particular implementation of the exposure apparatus 10. As will be discussed further herein, in certain embodiments, the control system 24 controls the movement of one or both of the stage assemblies 18, 20 in a manner that advantageously compensates for one or more effects of the stage motors upon the control system.

The exposure apparatus 10 is particularly useful as a lithographic device for semiconductor manufacturing. There are a number of different types of such lithographic devices. For example, the exposure apparatus 10 can be used as a scanning type photolithography system that exposes a pattern from a reticle 28 onto a wafer 30 with the reticle 28 and the wafer 30 moving synchronously. In a scanning type lithographic device, the reticle 28 is moved perpendicularly to an optical axis of the optical assembly 16 by the reticle stage assembly 18 and the wafer 30 is moved perpendicularly to the optical axis of the optical assembly 16 by the wafer stage assembly 20. Scanning of the reticle 28 and the wafer 30 occurs while the reticle 28 and the wafer 30 are moving synchronously.

Alternatively, the exposure apparatus 10 can be a step-and-repeat type photolithography system that exposes the reticle 28 while the reticle 28 and the wafer 30 are stationary. In the step and repeat process, the wafer 30 is in a constant position relative to the reticle 28 and the optical assembly 16 during the exposure of an individual field. Subsequently, between consecutive exposure steps, the wafer 30 is consecutively moved with the wafer stage assembly 20 perpendicularly to the optical axis of the optical assembly 16 so that the next field of the wafer 30 is brought into position relative to the optical assembly 16 and the reticle 28 for exposure. Following this process, the images on the reticle 28 are sequentially exposed onto the fields of the wafer 30, and then the next field of the wafer 30 is brought into position relative to the optical assembly 16 and the reticle 28.

Of course, the use of the exposure apparatus 10 provided herein is not limited to a photolithography system for semiconductor manufacturing. The exposure apparatus 10, for example, can be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern from a mask to a substrate with the mask located close to the substrate without the use of a lens assembly. In addition, the exposure apparatus 10 is merely one example of a precision stage device. In some embodiments, features of the invention may be useful for any type of precision stage device requiring high precision and accuracy in stage movement.

Referring again to FIG. 1, the apparatus frame 12 is rigid and supports the components of the exposure apparatus 10. The apparatus frame 12 supports the reticle stage assembly 18, the optical assembly 16 and the illumination system 14 above the mounting base 26. As can be seen, FIG. 1 and other figures also refer to an orientation reference having an X axis, a Y axis orthogonal to the X axis, and a Z axis orthogonal to the X and Y axes.

The illumination system 14 includes an illumination source 32 and an illumination optical assembly 34. The illumination source 32 emits a beam (irradiation) of light energy. The illumination optical assembly 34 guides the beam of light energy from the illumination source 32 to the optical assembly 16. The beam selectively illuminates different portions of the reticle 28 to expose the wafer 30. In FIG. 1, the illumination source 32 is illustrated as being supported above the reticle stage assembly 18. The illumination source 32 may, however, be secured to one of the sides of the apparatus frame 12 with the energy beam from the illumination source 32 directed to above the reticle stage assembly 18 with the illumination optical assembly 34.

The illumination source 32 can be a g-line source (436 nm), an i-line source (365 nm), a KrF excimer laser (248 nm), an ArF excimer laser (193 nm) or a $F_2$ laser (157 nm). Alternatively, the illumination source 32 can generate charged particle beams such as an x-ray or an electron beam. For instance, in the case where an electron beam is used, thermionic emission type lanthanum hexaboride ($LaB_6$) or tantalum (Ta) can be used as a cathode for an electron gun. Furthermore, in the case where an electron beam is used, the structure could be such that either a mask is used or a pattern can be directly formed on a substrate without the use of a mask.

The optical assembly 16 projects and/or focuses the light passing through the reticle 28 to the wafer 30. Depending upon the design of the exposure apparatus 10, the optical assembly 16 can magnify or reduce the image illuminated on the reticle 28. The optical assembly 16 need not be limited to a reduction system, but could also be a 1× or magnification system.

When far ultra-violet rays such as the excimer laser is used, glass materials such as quartz and fluorite that transmit far ultra-violet rays can be used in the optical assembly 16. When the $F_2$ type laser or x-ray is used, the optical assembly 16 can be either catadioptric or refractive (a reticle should also preferably be a reflective type), and when an electron beam is used, electron optics can consist of electron lenses and deflectors. The optical path for the electron beams should be in a vacuum.

Also, with an exposure apparatus that employs vacuum ultra-violet radiation (VUV) of wavelength 200 nm or lower, use of a catadioptric type optical system incorporating, for example, a beam splitter and concave mirror can be considered. The exposure apparatus may also use a reflecting-refracting type of optical system incorporating a concave mirror, etc., but without a beam splitter.

The reticle stage assembly 18 includes one or more reticle stages and stage motors that hold and position the reticle 28 relative to the optical assembly 16 and the wafer 30. Somewhat similarly, the wafer stage assembly 20 includes one or more wafer stages and stage motors that retain and move the wafer 30 with respect to the projected image of the illuminated portions of the reticle 28.

According to some embodiments, the measurement system 22 monitors the actual position and movement of the reticle 28 and the wafer 30 relative to the optical assembly 16 or some other reference. For example, the measurement system 22 can utilize multiple laser interferometers, encoders, and/or other measuring devices to determine the actual position of the one or more stages in the reticle stage assembly 18 and/or the wafer stage assembly 20. This information is communicated to the control system 24, which is coupled between the reticle stage assembly 18, the wafer stage assembly 20, and the measurement system 22. The control system 24 includes one or more processing modules (implemented in, e.g., hardware, firmware, or software) which process the position information in order to control the reticle stage assembly 18 to precisely position the reticle 28 and the wafer stage assembly 20 to precisely position the wafer 30.

Figure 2:
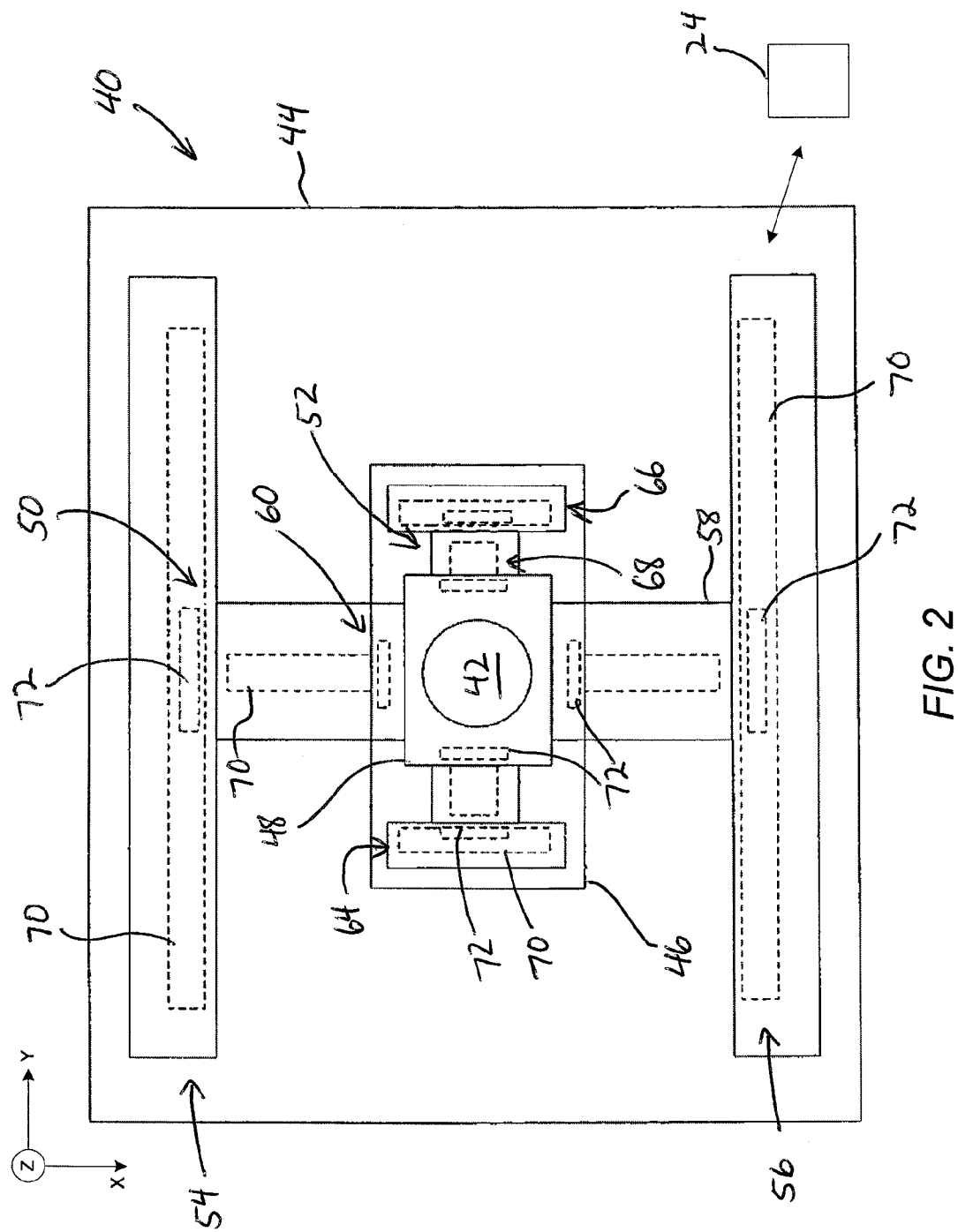
FIG. 2 is a top view of a stage assembly and a control system in accordance with an embodiment of the invention.

FIG. 2 is a simplified top view of a stage assembly 40 and a control system 24 that can be used to position a substrate 42 in accordance with an embodiment of the invention. For example, the stage assembly 40 can be used as the wafer stage assembly 20 in the exposure apparatus 10 of FIG. 1. Alternatively, the stage assembly 40 can be used to move other types of substrates 42 during manufacturing and/or inspection, to move a device under an electron microscope (not shown), or to move a device during a precision measurement operation (not shown).

In this embodiment, the stage assembly 40 includes a stage base 44, a first stage 46, a second stage 48, a first motor assembly 50, and a second motor assembly 52. The size, shape, and design of each these components can be varied. The control system 24 controls the motor assemblies 50, 52 to precisely position the substrate 42.

The first stage 46 allows relatively large movements of the second stage 48 and is commonly referred to as a coarse stage.

The first stage 46 supports the second stage 48 and the second motor assembly 52. A bearing (not shown) supports the first stage 46 above the stage base 44 and allows the first stage 46 to move relative to the stage base 44 along the X and Y axes and about the Z axis.

The first motor assembly 50 moves the first stage 46 and in this embodiment, the second motor assembly 52, relative to the stage base 44. The first motor assembly 50 can include one or more motors, which are depicted in phantom in FIG. 2. For example, one or more motors may be provided to move the first stage 46 with one or more degrees of freedom (DOF). In the embodiment shown, the first motor assembly 50 includes a first Y motor 54 and a second Y motor 56, coupled by a first guide bar 58. The first motor assembly further includes a first X motor 60 mounted on the first guide bar 58 to provide movement of the first stage 46 along the X axis.

The second motor assembly 52 moves and positions the second stage 48 and the substrate 42 and is commonly referred to as a fine stage. In the embodiment illustrated in FIG. 2, a bearing (not shown) supports the second stage 48 above the first stage 46 and allows the second stage 48 to move relative to the first stage 46 along the X and Y axes and about the Z axis.

The second motor assembly 52 can include one or more motors depending upon the number of degrees of freedom desired for the second stage 48 and the particular implemented design. FIG. 2 illustrates an embodiment in which the second motor assembly 52 includes a second guide bar 62 coupling a second X motor 64 and a third X motor 66 for finely adjusting the position of the second stage 48 along the X axes. A third Y motor 68 is mounted on the second guide bar 62 to provide fine adjustment along the Y axes. The motors 64, 66, and 68 are depicted in phantom in FIG. 2.

The design of each motor can be varied to suit the movement requirements of the first and second motor assemblies 50, 52. For example, when linear motors (see, for example, U.S. Pat. Nos. 5,623,853 and 5,528,118, both of which are herein incorporated by reference) are used to move a wafer stage or a mask stage in photolithography systems, the linear motors can be an air levitation type employing air bearings or a magnetic levitation type using Lorentz force or reactance force.

In alternative embodiments, one of the stages could be driven by a motor assembly including one or more planar motors. Planar motors typically drive the stage by an electromagnetic force generated by a magnet unit having two-dimensionally arranged magnets and an armature coil unit having two-dimensionally arranged coils in facing positions. With this type of driving system, either the magnet unit or the armature coil unit is connected to the stage and the other unit is mounted on the moving plane side of the stage. Alternatively, one or more of the motors can be another type of motor, such as a rotary motor, a voice coil motor, or some other electromagnetic motor.

In the embodiment illustrated in FIG. 2, each of the motors in the first and second motor assemblies 50, 52 includes a linear motor configuration with a stationary member 70 and one or more moving members 72 that interact with the stationary member 70. For example, the motor assemblies may include one or more electric linear motors described in U.S. Pat. No. 6,570,273, the content of which is herein incorporated by reference. Each stationary member 70 may include a magnet array having one or more permanent magnets, and each moving member 72 may include a conductor array that includes one or more coils. When the moving member 72 is energized by the control system 24, the coil currents interact with the magnetic fields generated by the magnet array on the stationary member 70 to impart a force on the moving member 72, which in turn moves the first or second stage. Alternatively, the moving member 72 may include a permanent magnet array, while the stationary member 70 may include a coil array.

The stage motors within the first and second motor assemblies 50, 52 can allow the control system 24 to quickly and precisely position the first and/or second stages 46, 48. However, it has been discovered that in some cases the motors themselves can affect stage movement.

Figure 3:
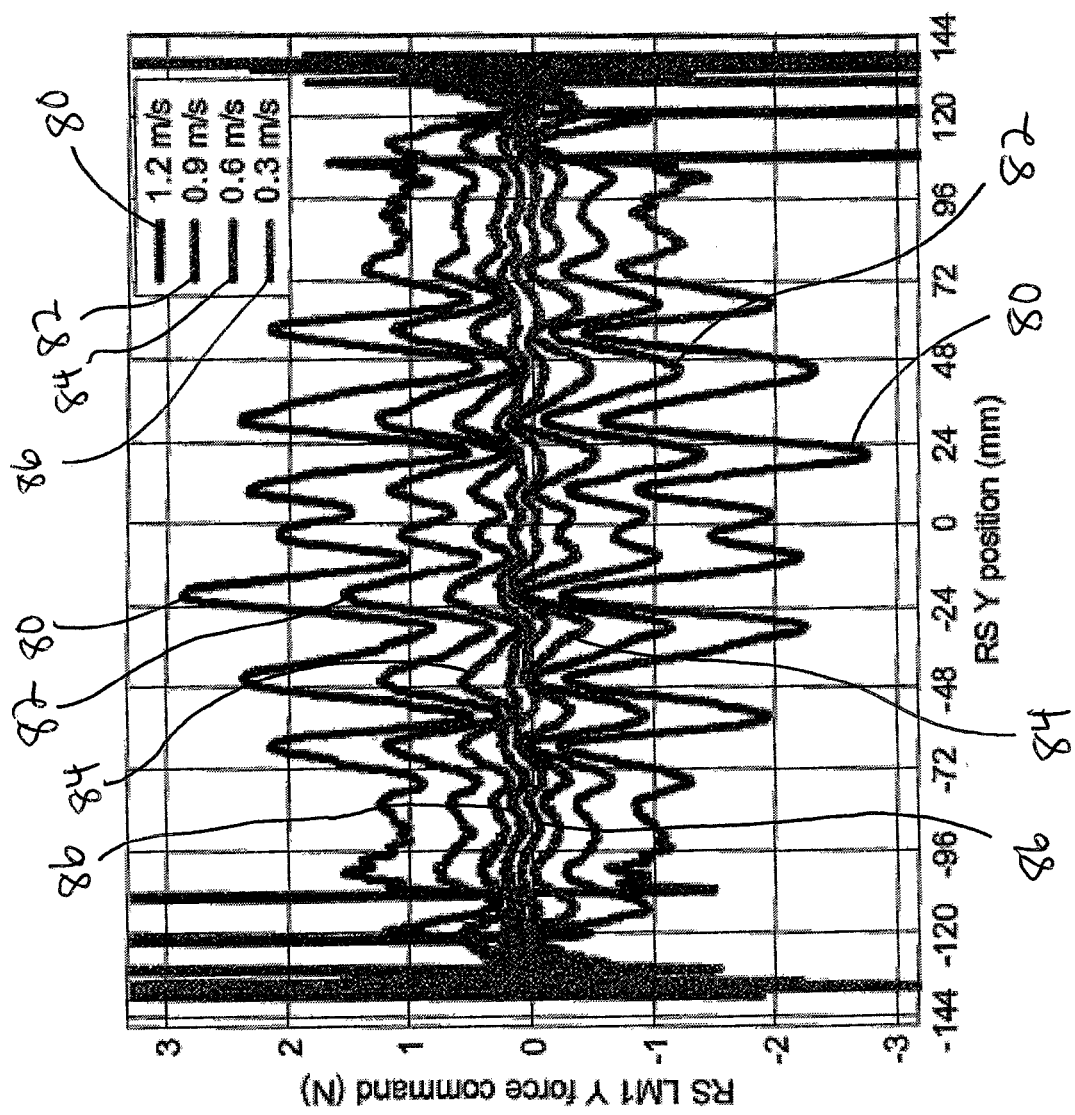
FIG. 3 are plots of a linear motor force showing a ripple force versus position along an axis in accordance with an embodiment of the invention

FIG. 3 depicts, in accordance with an embodiment of the invention, plots 80, 82, 84, 86 of a linear motor force versus position along a range of movement for multiple respective stage speeds of 1.2 m/s, 0.9 m/s, 0.6 m/s, and 0.3 m/s. As can be seen, the force signals include a large force ripple that increases with motor speed and varies with the position of the stage. The inventors have determined that at least portions of the force ripple are caused by the motor itself, due to a back-electromotive force (back-EMF) generated by the motor as it moves through the range of movement. For example, as the moving member of the motor moves relative to the motor's stationary member, the motor's coil windings may generate a back-EMF as the coil windings experience increasing and decreasing magnetic fields produced by a magnet array on the motor's stationary member. The back-EMF opposes the control signal, which leads to movement errors, such as the force ripple illustrated in FIG. 3.

In other cases, an inductive and/or resistive effect of a stage motor can affect the dynamic response of the motor to a change in control signal. For example, as the current in the motor control signal changes, an inductance and a resistance of the motor may oppose the signal change according to the equation $V = L\, di/dt + iR$. Accordingly, the response time of the motor may slow to allow the control system to generate an appropriate voltage in response to the effect of the motor's inductance and resistance.

Figure 4A:
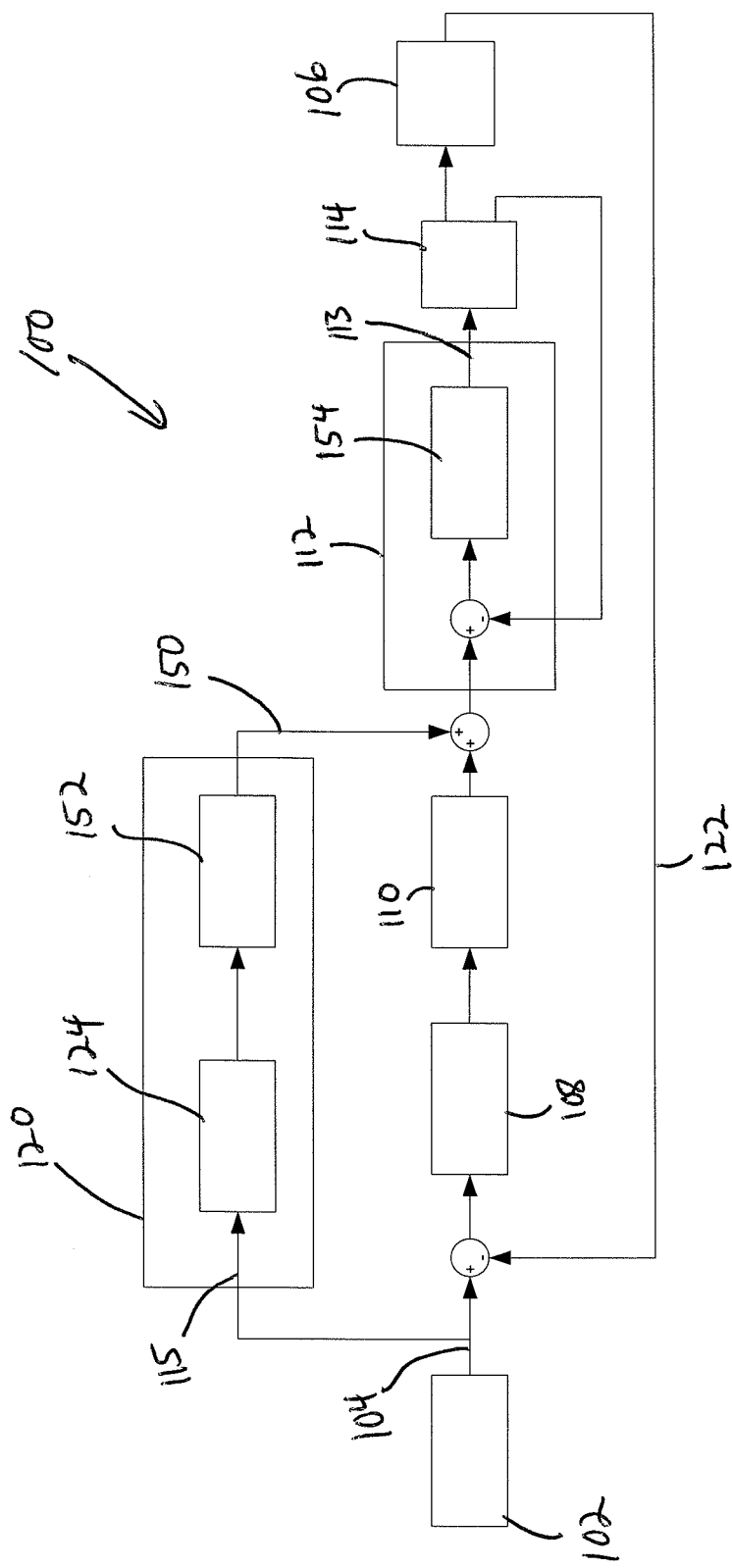
FIG. 4A is a schematic illustration of a control system configured to compensate for motor effects in accordance with an embodiment of the invention.
Figure 4B:
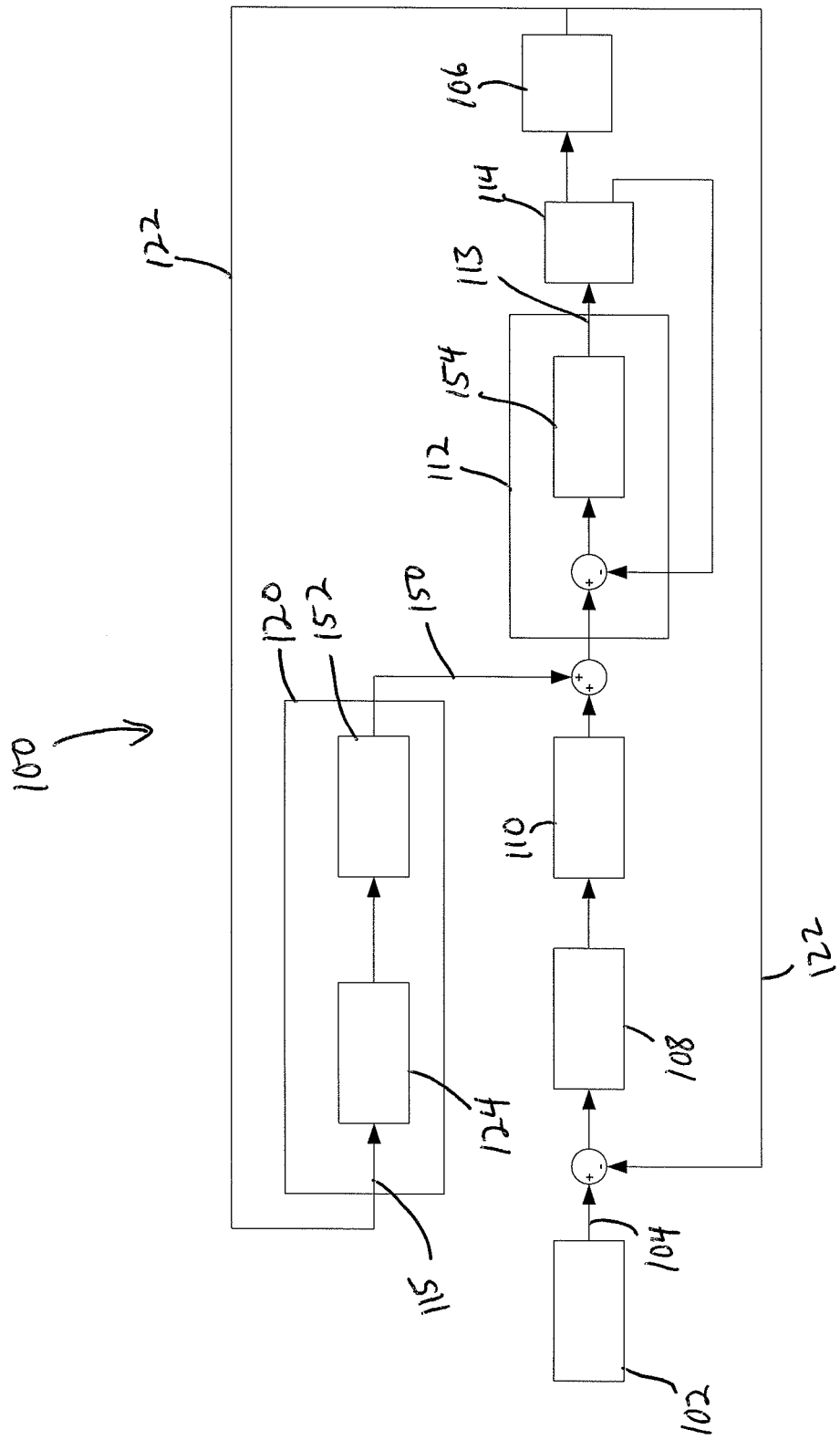
FIG. 4B is a schematic illustration of a control system configured to compensate for motor effects in accordance with an embodiment of the invention.

In some embodiments of the invention, a control system is provided for compensating for effects of a stage motor. Referring now to FIGS. 4A and 4B, high-level depictions of a control system 100 for controlling the movement of a stage and compensating for effects of a stage motor is shown in accordance with an embodiment of the invention. In general terms, the control system 100 has an input 102 for receiving a position reference or trajectory control signal 104 indicating a desired trajectory for moving a stage 106. The control system 100 combines the desired trajectory with a measurement 122 of a position of the stage 106 to form an error signal, which is the input to a controller 108. The controller 108 then generates a force command for moving the stage 106.

For a multi-phase motor assembly, the force command is sent to a commutator 110, which generates one or more current command signals for respective phases of a motor. The current command signals are sent to a plurality of drive modules or amplifiers for driving the phases, which are illustrated as a single drive module 112 and a single motor phase 114 in FIG. 4 for simplicity and clarity. In some cases, the drive module for each motor in a stage assembly may include more than one amplifier for each phase of the motor. The drive module 112 then generates a motor control signal 113 for driving each phase of the motor 114 to move the stage 106.

In some embodiments of the invention, the control system 100 includes a feedforward module 120 that generates a feedforward control signal 150 based on an input signal 115 corresponding to an effect of the motor upon the motor control signal 113. The feedforward module 120 can then compensate for undesired effects of the motor 114 upon the motor control signal 113. The feedforward module 120 may be configured, for example, to compensate for a back-EMF generated by a stage motor 114.

The input signal 115 may indicate the effect of the motor in a variety of ways. For example, in one embodiment, the input signal 115 may indicate a position or velocity of the stage 106 (and thus the moving member of the motor 114), which can be used to determine an effect of the motor 114. In this case, the input signal 115 may be either predetermined, or in some cases may be measured as the stage moves. As shown in FIG. 4A, in some embodiments, the input signal 115 comprises the predetermined trajectory control signal 104, indicating the desired position of the stage 106.

As shown in FIG. 4B, according to some embodiments, the input signal 115 may include the feedback signal 122. For example, the control system 100 can include a feedback system (not shown in FIG. 4) configured to generate and output a feedback signal 122 indicating a back-EMF generated by the motor 114. The feedback signal 122 may indirectly indicate the back-EMF of the motor 114 by conveying the current position of a moving member of the motor 114 to the feedforward module 120. In FIG. 4, the feedback signal 122 includes the measured position of the stage 106. In such a case, the feedback system may include a measurement system, such as the measurement system 22 depicted in the FIG. 1, that determines the position and/or velocity of the stage and thus the moving member of the motor. The feedback system conveys this information to the feedforward module 120 via the feedback signal 122 and input signal 115.

In some embodiments, including the embodiment illustrated in FIG. 4, the feedforward module 120 includes an analysis module 124 that receives the input signal 115 and determines the value of the back-EMF corresponding to the position of the moving member and stage. In some cases the analysis module 124 may determine the back-EMF according to a predetermined relationship between the position (e.g., desired or predicted position or measured position) of the moving member and the associated back-EMF. For example, the analysis module 124 may calculate the back-EMF according to an equation describing the relationship between the back-EMF for a particular phase and position of the motor 114.

In some embodiments, the analysis module 124 includes a lookup table that includes multiple values of the back-EMF associated with respective positions of the motor. Generating the lookup table may involve measuring actual back-EMF values during experimentation or simulating or modeling the back-EMF values for positions along the range of movement.

Figure 5:
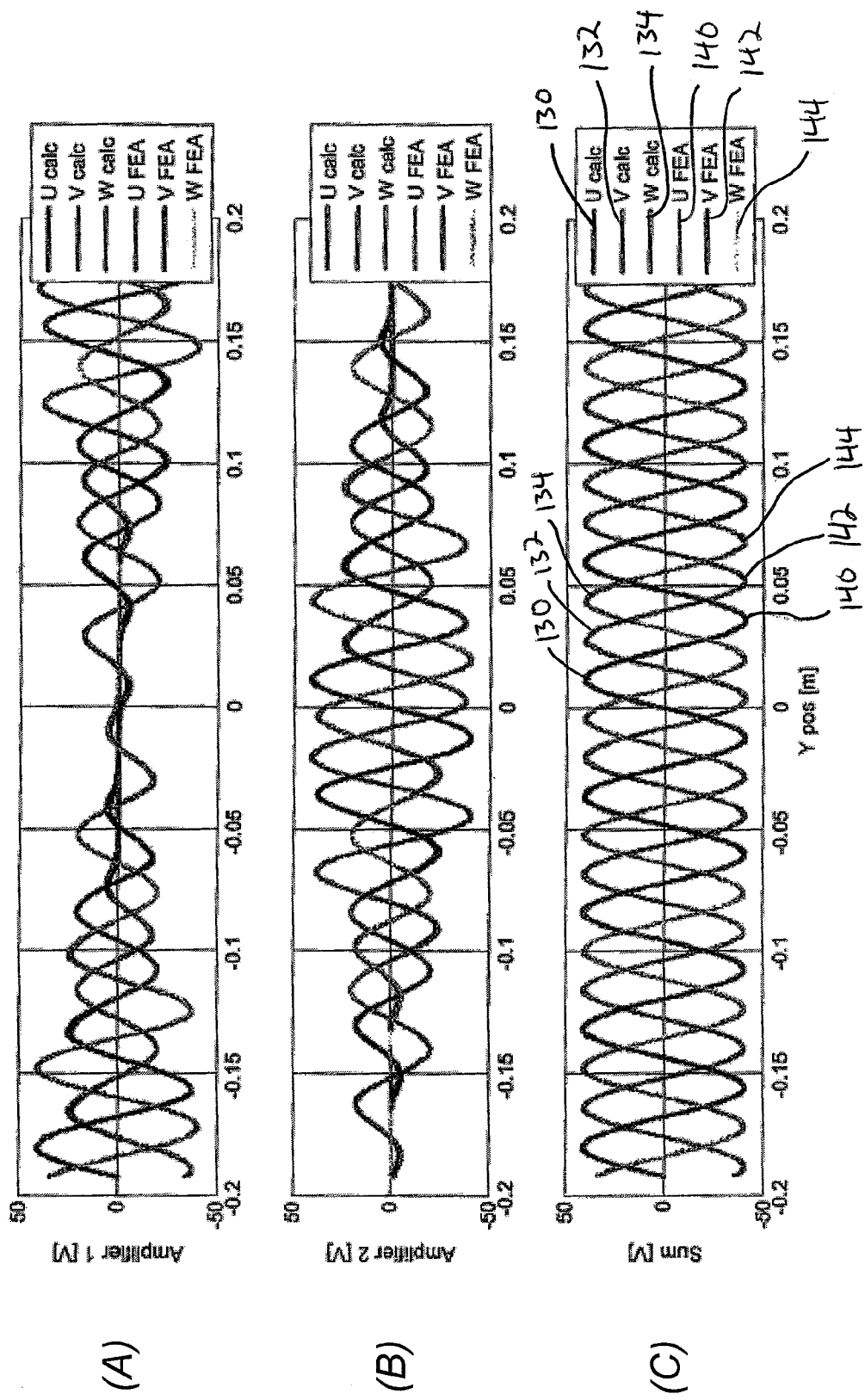
FIGS. 5A-5C are plots simulating an electromotive force generated by a motor in accordance with an embodiment of the invention.
Figure 6:
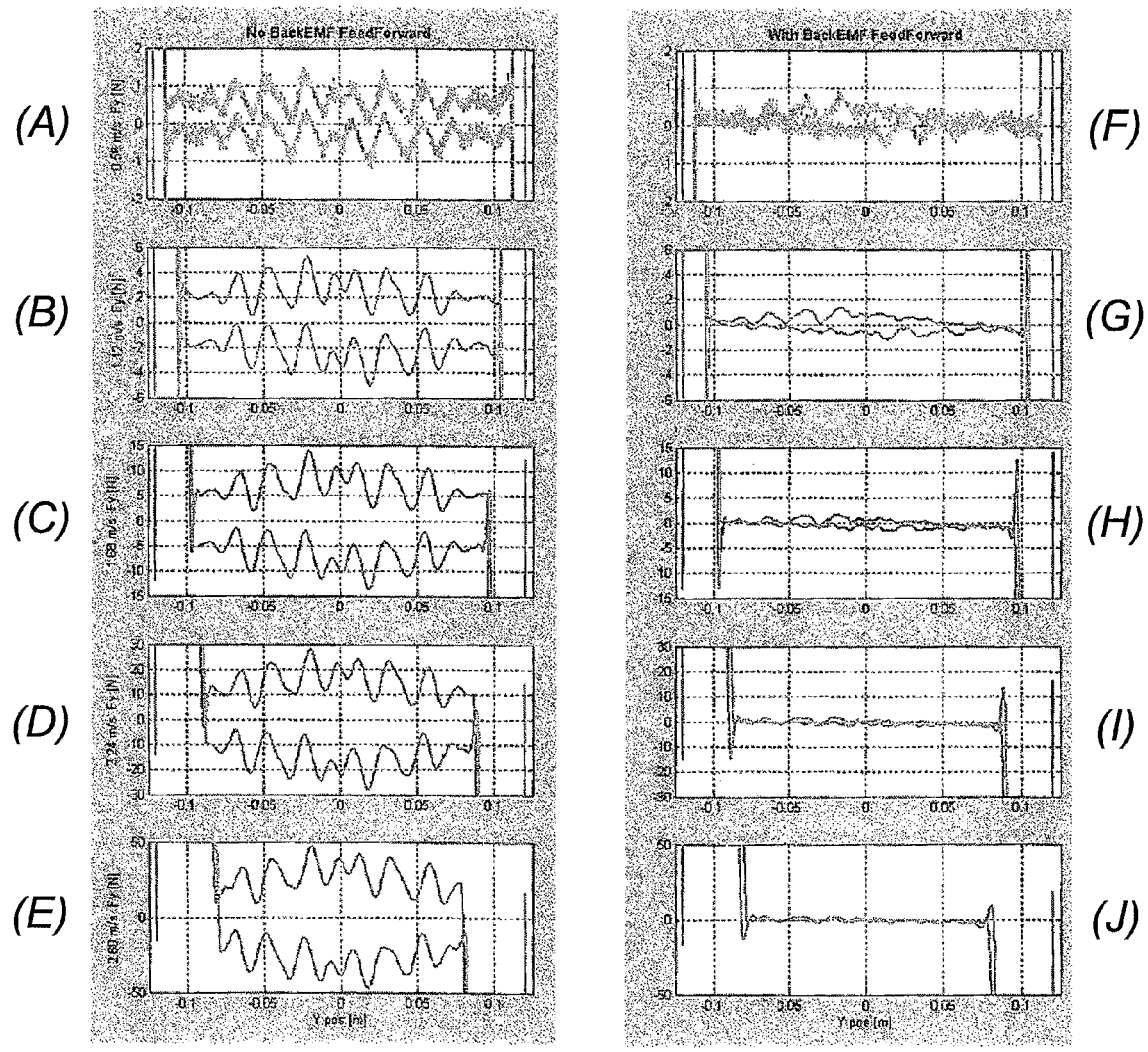
FIGS. 6A-6J are plots of a motor force including a force ripple and plots including compensation for the force ripple in accordance with an embodiment of the invention.

FIG. 5 depicts plots of a modeled or simulated back-EMF generated in a three-phase motor having two amplifiers per phase. In some embodiments, a linear approximation may be used to calculate the back-EMF based on where a motor's coils are in relation to the one or more magnetic fields generated by the motor's magnet array. For example, when a coil (e.g., moving member) is passing out of a magnetic field, the back-EMF can be assumed to decrease linearly to zero when the coil is fully outside the field. FIG. 5C illustrates the sum of the back-EMF signals calculated in this way for two amplifiers and three phases, including a U phase 130, a V phase 132, and a W phase 134.

In another embodiment, the back-EMF values for positions along the range of movement may be modeled using a finite element analysis. FIG. 5C shows plots of the sum of the back-EMF signals calculated in this way for two amplifiers and three phases, including a U phase 140, a V phase 142, and a W phase 144. As can be seen from FIG. 5C, a linear approximation of the back-EMF can provide an approximation very similar to a finite element analysis.

Returning to FIGS. 4A and 4B, the feedforward module 120, by lookup table or calculation, generates a feedforward control signal 150 based on the input signal 115. In some embodiments, the feedforward control signal 150 may be based on a value of the back-EMF for a current position or velocity of the motor and/or stage. In other embodiments, the feedforward control signal 150 may be based on an expected value of the back-EMF for a future position or velocity of the motor/stage. Thus, a more timely feedforward signal can be generated taking into account transmission time delays within the control system 100.

In some embodiments, the feedforward module 120 includes a signal generator 152 that receives the value of the back-EMF from the analysis module 124 and generates the feedforward control signal 150 based on a predetermined transform function. For example, the signal generator 152 may format the feedforward control signal 150 to modify the motor control signal 113 using the drive module's preexisting drive circuit 154, e.g., a current controller. In this embodiment, the signal generator 152 can apply an inverse transform of the drive circuit 154 to the signal received from the analysis module 124. This advantageously allows the feedforward module 120 to compensate for the back-EMF without altering the design of the drive module 112.

In a multi-phase embodiment, the signal generator 152 may generate multiple feedforward control signals for each phase of the motor 114 and forward these to the appropriate drive modules 112 for each motor phase (e.g., two drive modules or amplifiers per phase per motor). Although FIG. 4 is a high-level diagram and does not depict multiple drive modules or feedforward signals, those skilled in the art will appreciate that multiple elements may be included depending upon the implemented embodiment of the invention.

Figure 7:
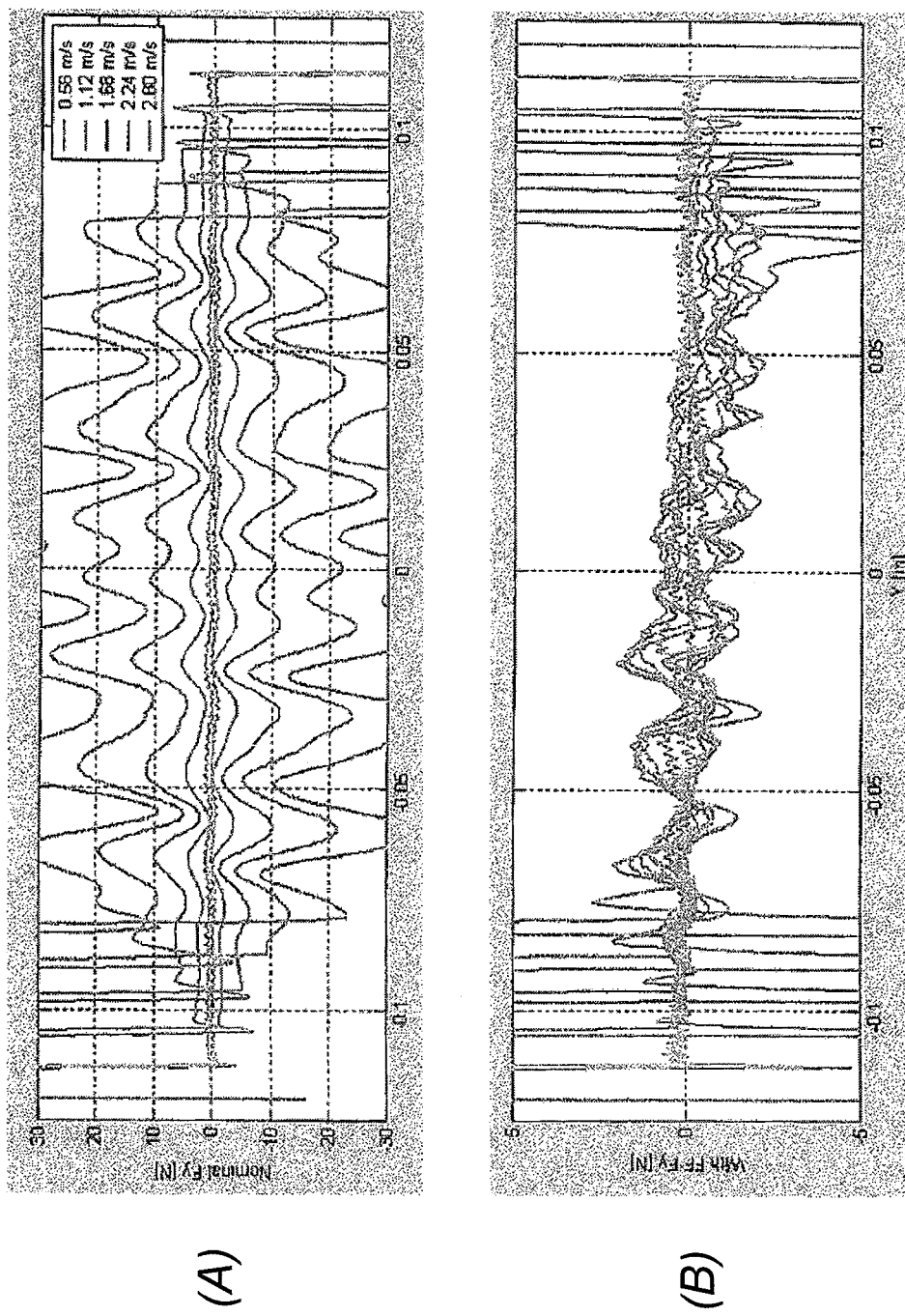
FIGS. 7A-7B are superimposed plots of the motor force shown in FIGS. 6A-6J.

Upon receiving the feedforward control signal 150, the drive module 112 modifies the motor control signal 113 to compensate for the effect of the motor's back-EMF. FIGS. 6A-6E illustrate plots of force ripple in the motor operation due to back-EMF, while FIGS. 6F-6J illustrate, respectively, plots of the motor operation after modifying the motor control signal according to embodiments of the invention. As can be seen, identification of and compensation for the back-EMF using a feedforward control signal can greatly reduce unwanted force ripple. FIG. 7A illustrates the superimposed plots of FIGS. 6A-6E, while FIG. 7B illustrates the superimposed plots of FIGS. 6F-6J.

Figure 8:
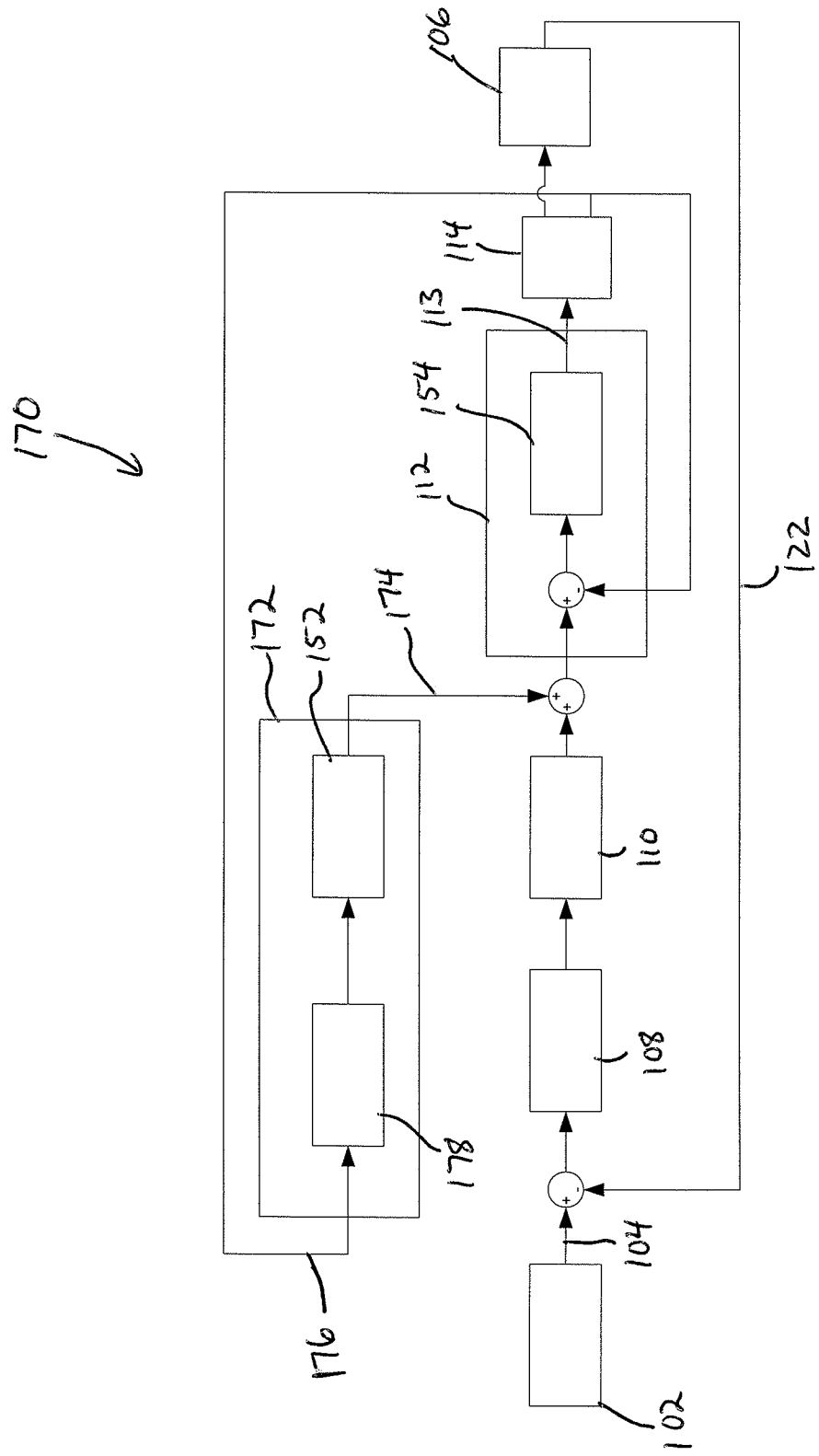
FIG. 8 is a schematic illustration of a control system configured to compensate for motor effects in accordance with an embodiment of the invention.

FIG. 8 is a high-level schematic of another control system 170 that can be used to compensate for an effect of the motor 114 according to additional embodiments of the invention. In particular, the control system 170 includes a feedforward module 172 configured to generate a feedforward control signal 174 to compensate for an inductive and/or resistive effect of the motor 114. In FIG. 8, a feedback module (not shown), may include a measurement system to measure a change in current in the motor control signal 113 and generate an input signal 176 indicating the effect of the motor 114 on the motor control signal 113.

The feedforward module 172 can include an analysis module 178 which receives the input signal 176 and determines a feedforward voltage based on the inductance and resistance of the motor 114 and the change in current signaled by the input signal 176. For example, the analysis module 178 may include a lookup table including multiple values of an expected voltage corresponding to inductance, resistance and current. In other embodiments, the analysis module 178 may know the inductance and resistance of the motor 114 and calculate the feedforward voltage according to the relationship $V = L\, di/dt + iR$.

In some embodiments, the feedforward voltage may be directly applied to the drive module 112 to modify the motor control output 113. Alternatively, the feedforward voltage may first be transformed by the signal generator 152 based on the inverse transform of the drive module's drive circuit 154. Such an embodiment can be advantageous as a conventional drive module may be utilized without additional inputs for the feedforward voltage.

Thus, the feedforward module 172 can compensate for the inductive effect of the motor 114 by generating, based on the input signal 176, the feedforward control signal 174 to modify the motor control output 113.

A photolithography system (e.g., an exposure apparatus or stage device) according to the embodiments described herein can be built by assembling various subsystems, including each element listed in the appended claims, in such a manner that prescribed mechanical accuracy, electrical accuracy, and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, a total adjustment is performed to make sure that accuracy is maintained in the complete photolithography system. Additionally, it is desirable to manufacture an exposure system in a clean room where the temperature and cleanliness are controlled.

Figure 9:
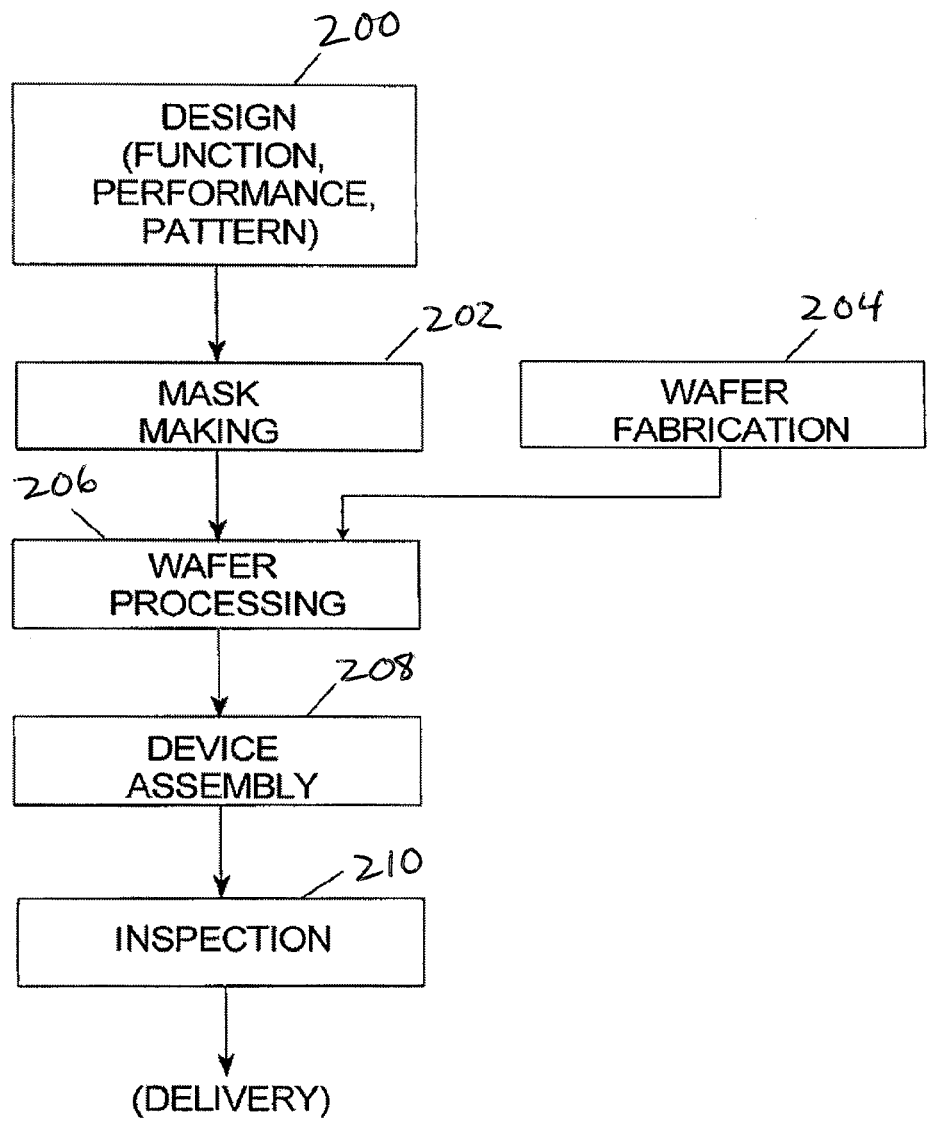
FIG. 9 is a process flow diagram illustrating a method of fabricating a semiconductor device according to an embodiment of the invention.

Further, semiconductor devices may be fabricated using systems described above, as will be discussed with reference to FIG. 9. The process begins at step 200 in which the function and performance characteristics of a semiconductor device are designed or otherwise determined. Next, in step 202, a reticle (i.e., mask) having a pattern is designed based upon the design of the semiconductor device. It should be appreciated that in a parallel step 204, a wafer is made from a silicon material. The mask pattern designed in step 202 is exposed onto the wafer fabricated in step 204 in step 206 by a photolithography system that can include a coarse reticle scanning stage and a fine reticle scanning stage. One process of exposing a mask pattern onto a wafer will be described below with respect to FIG. 10. In step 208, the semiconductor device is assembled. The assembly of the semiconductor device generally includes, but is not limited to, wafer dicing, bonding, and packaging processes. Finally, the completed device is inspected in step 210 and delivered.

Figure 10:
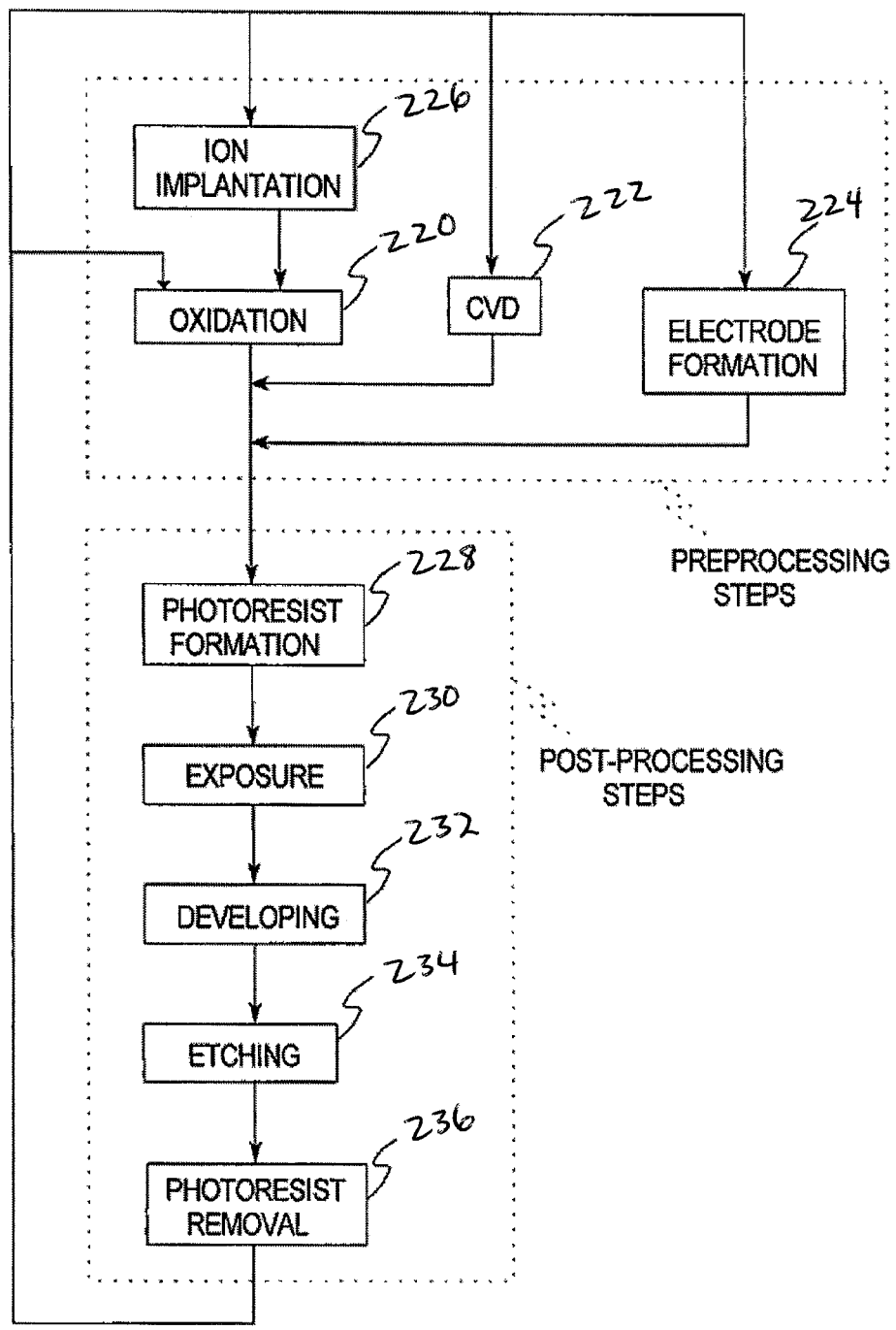
FIG. 10 is a process flow diagram illustrating in detail the method of wafer processing of FIG. 9.

FIG. 10 is a process flow diagram which illustrates the steps associated with wafer processing in the case of fabricating semiconductor devices in accordance with an embodiment of the present invention. In step 220, the surface of a wafer is oxidized. Then, in step 222 which is a chemical vapor deposition (CVD) step, an insulation film may be formed on the wafer surface. Once the insulation film is formed, in step 224, electrodes are formed on the wafer by vapor deposition. Then, ions may be implanted in the wafer using substantially any suitable method in step 226. As will be appreciated by those skilled in the art, steps 220-226 are generally considered to be preprocessing steps for wafers during wafer processing. Further, it should be understood that selections made in each step, e.g., the concentration of various chemicals to use in forming an insulation film in step 222, may be made based upon processing requirements.

At each stage of wafer processing, when preprocessing steps have been completed, post-processing steps may be implemented. During post-processing, initially, in step 228, photoresist is applied to a wafer. Then, in step 230, an exposure apparatus such as one having one or more exemplary systems described herein may be used to transfer the circuit pattern of a reticle to a wafer.

After the circuit pattern on a reticle is transferred to a wafer, the exposed wafer is developed in step 232. Once the exposed wafer is developed, parts other than residual photoresist, e.g., the exposed material surface, may be removed by an etching step 234. Finally, in step 236, any unnecessary photoresist that remains after etching may be removed. As will be appreciated by those skilled in the art, multiple circuit patterns may be formed through the repetition of the preprocessing and post-processing steps.

Thus, embodiments of CONTROL SYSTEMS AND METHODS FOR COMPENSATING FOR EFFECTS OF A STAGE MOTOR are disclosed. Although the present invention has been described in considerable detail with reference to certain disclosed embodiments, the disclosed embodiments are presented for purposes of illustration and not limitation and other embodiments of the invention are possible. One skilled in the art will appreciate that various changes, adaptations, and modifications may be made without departing from the spirit of the invention and the scope of the appended claims.

What is claimed is:

1. A method for compensating for an effect of a motor that moves a stage in a stage device, the method comprising the steps of:
    generating an error signal by combining a desired trajectory of the stage and a measured position of the stage;
    generating a feedback signal with a feedback controller using the error signal;
    receiving an input signal corresponding to an effect of the motor, the input signal indicating a position of a moving member of the motor, wherein the effect of the motor comprising an electromotive force that varies with a movement of the moving member of the motor through a magnetic field;
    generating a feedforward control signal based on the input signal using a feedforward module that includes an analysis module that analyzes the input signal and estimates the effect of the motor to generate the feedforward control signal; wherein the step of generating the feedforward control signal includes the step of determining a value of the electromotive force corresponding to a future position of the moving member;
    summing the feedback signal and the feedforward control signal;
    generating a motor control signal from the summed feedback signal and feedforward control signal using a drive module; and
    sending the motor control signal from the drive module to the motor, thereby moving the stage of the stage device and compensating for the effect of the motor.

2. The method of claim 1 wherein the step of generating the feedforward control signal includes the analysis module determining a value of the electromotive force corresponding to the position of the moving member.

3. The method of claim 1 further comprising the step of utilizing a lookup table having a plurality of values of the electromotive force corresponding to a respective plurality of positions of the moving member.

4. The method of claim 1 wherein the step of generating a motor control signal includes the drive module including a drive circuit, and wherein the step of generating the feedforward control signal includes the step of transforming a value of the electromotive force based on an inverse transfer function of the drive circuit.

5. The method of claim 1 wherein the step of receiving the input signal includes the input signal being a feedback signal indicating a measured position of the moving member.

6. The method of claim 1 wherein the step of receiving the input signal includes the effect of the motor comprising an inductive effect.

7. The method of claim 6 wherein the step of generating the feedforward control signal includes the analysis module determining a feedforward voltage based on the input signal and an inductance of the motor.

8. The method of claim 7 wherein the step of generating a motor control signal includes the drive module including a drive circuit, and wherein the step of generating the feedforward control signal further includes the step of transforming the feedforward voltage with a signal generator based on an inverse transfer function of the drive circuit.

9. A method of operating an exposure apparatus comprising transporting a substrate with a stage having one or more motors, controlling the one or more motors to move the substrate, compensating for an effect of the one or more motors using the method of claim 1, and exposing the substrate with radiant energy.

10. A method of making a device including at least a photolithography process, wherein the photolithography process uses the method of operating an exposure apparatus of claim 9.

* * * * *